United States Patent
Gibson et al.

(10) Patent No.: US 11,466,362 B2
(45) Date of Patent: Oct. 11, 2022

(54) APPARATUS AND METHODS FOR DEPOSITING DURABLE OPTICAL COATINGS

(71) Applicant: UNIVERSITY OF THE WEST OF SCOTLAND, Paisley Renfrewshire (GB)

(72) Inventors: Desmond Gibson, Helensburgh (GB); Shigeng Song, Paisley Renfrewshire (GB)

(73) Assignee: UNIVERSITY OF THE WEST OF SCOTLAND, Paisley (GB)

(*) Notice: Subject to any disclaimer, the term of this patent is extended or adjusted under 35 U.S.C. 154(b) by 27 days.

(21) Appl. No.: 16/607,838

(22) PCT Filed: Apr. 25, 2018

(86) PCT No.: PCT/GB2018/051081
§ 371 (c)(1),
(2) Date: Oct. 24, 2019

(87) PCT Pub. No.: WO2018/197867
PCT Pub. Date: Nov. 1, 2018

(65) Prior Publication Data
US 2020/0190659 A1    Jun. 18, 2020

(30) Foreign Application Priority Data
Apr. 25, 2017 (GB) .................... 1706581

(51) Int. Cl.
*C23C 14/35* (2006.01)
*C23C 14/58* (2006.01)
(Continued)

(52) U.S. Cl.
CPC .......... *C23C 14/352* (2013.01); *C23C 14/042* (2013.01); *C23C 14/3407* (2013.01);
(Continued)

(58) Field of Classification Search
CPC . C23C 14/352; C23C 14/042; C23C 14/3407; C23C 14/3464; C23C 14/3485;
(Continued)

(56) References Cited

U.S. PATENT DOCUMENTS 3,926,271 A * 12/1975 Patashnick ............... G01G 3/16
                                                   177/210 R
4,498,728 A * 2/1985 Thoni .................. C03C 17/3452
                                                   359/359
(Continued)

FOREIGN PATENT DOCUMENTS

EP       1359236 A1    11/2003
WO      9901277 A1     1/1999
(Continued)

OTHER PUBLICATIONS

Hu, et al., "Ge1_xCx double-layer antireflection and protection coatings," Applied Surface Science, vol. 252 (2006) pp. 8135-8138.
(Continued)

*Primary Examiner* — Jennifer Wecker
*Assistant Examiner* — Patrick S Ott
(74) *Attorney, Agent, or Firm* — Snell & Wilmer L.L.P.; Kent A. Lembke

(57) ABSTRACT

Apparatus for depositing germanium and carbon onto one or more substrates comprises a vacuum chamber, at least first and second magnetron sputtering devices and at least one movable mount for supporting the one or more substrates within the vacuum chamber. The first magnetron sputtering device is configured to sputter germanium towards the at least one mount from a first sputtering target comprising germanium, thereby defining a germanium sputtering zone within the vacuum chamber. The second magnetron sputtering device is configured to sputter carbon towards the at least one mount from a second sputtering target comprising
(Continued)

carbon, thereby defining a carbon sputtering zone within the vacuum chamber. The at least one mount and the at least first and second magnetron sputtering devices are arranged such that, when each substrate is moved through the germanium sputtering zone on the at least one movable mount, germanium is deposited on the said substrate, and when each substrate is moved through the carbon sputtering zone on the at least one movable mount, carbon is deposited on the said substrate.

20 Claims, 7 Drawing Sheets

(51) Int. Cl.
C23C 14/04 (2006.01)
C23C 14/34 (2006.01)
C23C 14/50 (2006.01)
C23C 14/54 (2006.01)
G02B 5/20 (2006.01)
G02B 5/28 (2006.01)
H01J 37/34 (2006.01)

(52) U.S. Cl.
CPC ...... *C23C 14/3464* (2013.01); *C23C 14/3485* (2013.01); *C23C 14/505* (2013.01); *C23C 14/545* (2013.01); *C23C 14/5826* (2013.01); *G02B 5/207* (2013.01); *G02B 5/208* (2013.01); *G02B 5/289* (2013.01); *H01J 37/3408* (2013.01); *H01J 37/3417* (2013.01); *H01J 37/3455* (2013.01); *H01J 37/3467* (2013.01)

(58) Field of Classification Search
CPC . C23C 14/505; C23C 14/545; C23C 14/5826; C23C 14/568; C23C 14/06; C23C 14/0605; C23C 14/0635; G02B 5/207; G02B 5/208; G02B 5/289; G02B 5/285; H01J 37/3408; H01J 37/3417; H01J 37/3455; H01J 37/3467
See application file for complete search history.

(56) References Cited

U.S. PATENT DOCUMENTS

| 4,859,536 | A | 8/1989 | Waddell et al. | |
| 5,425,983 | A | 6/1995 | Propst et al. | |
| 6,171,714 | B1* | 1/2001 | Bergkessel | C23C 14/022 428/618 |
| 6,461,731 | B1* | 10/2002 | Veerasamy | B05D 5/083 428/408 |
| 7,086,918 | B2* | 8/2006 | Hsiao | H01L 51/5253 445/24 |
| 7,903,338 | B1* | 3/2011 | Wach | A61B 5/0084 359/588 |
| 2004/0026240 | A1* | 2/2004 | Shidoji | C23C 14/568 204/298.03 |
| 2004/0043218 | A1 | 3/2004 | Johnson et al. | |
| 2005/0006768 | A1* | 1/2005 | Narasimhan | H01L 21/31637 257/E21.279 |
| 2005/0202173 | A1* | 9/2005 | Mills | B01J 19/088 427/249.7 |
| 2014/0131198 | A1* | 5/2014 | Teng | C23C 14/0623 204/298.07 |
| 2014/0329070 | A1 | 11/2014 | Draxler et al. | |

FOREIGN PATENT DOCUMENTS

| WO | WO-9901277 A1 * | 1/1999 | ............ C23C 14/024 |
| WO | 2013086552 A1 | 6/2013 | |
| WO | 2015171149 A1 | 11/2015 | |
| WO | WO-2015171149 A1 * | 11/2015 | ............. C23C 14/22 |

OTHER PUBLICATIONS

Jiecai Han et al. "Non-hydrogenated amorphous germanium carbide with adjustable microstructure and properties: a potential antireflection and protective coating for infrared windows" Research article, published online in Wiley Online Jbrary Jul. 24, 2012. Surf. Interface Anal. 2013, 45, pp. 685-690.

Des Gibson et al. "Durable infrared optical coatings based on pulsed DC-sputtering of hydrogenated amorphous carbon (a-C:H)" Research article. Applied Optics. vol. 59, No. 9. Mar. 20, 2020. pp. 2731-2738.

J.Q. Ahu et al. "Multilayer antireflective and protective coatings comprising amorphous diamond and amorphous hydrogenated germanium carbide for ZnS optical elements" online Aug. 9, 2007. Thing Solid Films 516 (2008) pp. 3117-3122.

* cited by examiner

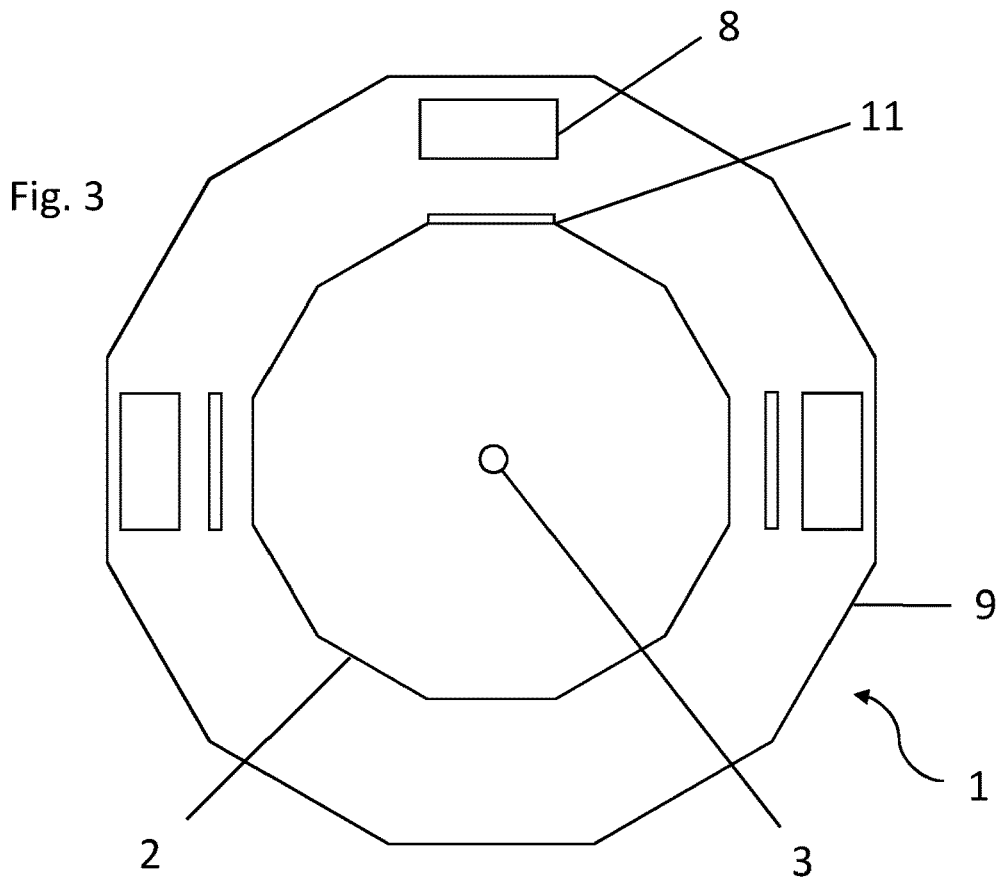
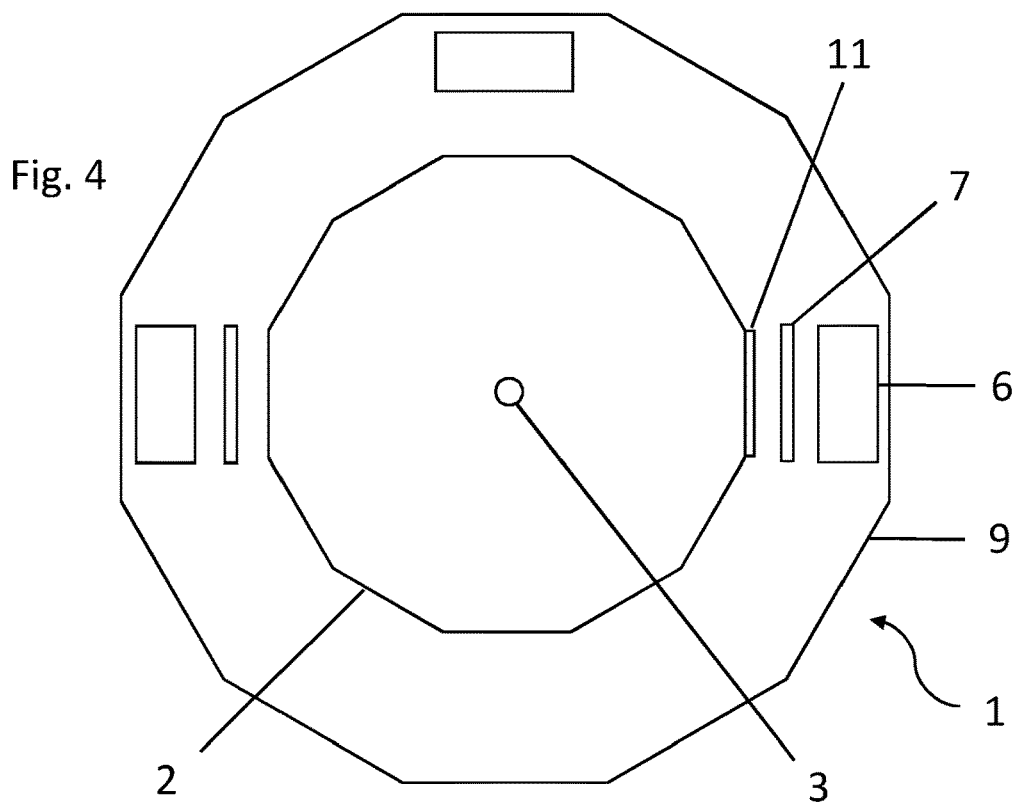

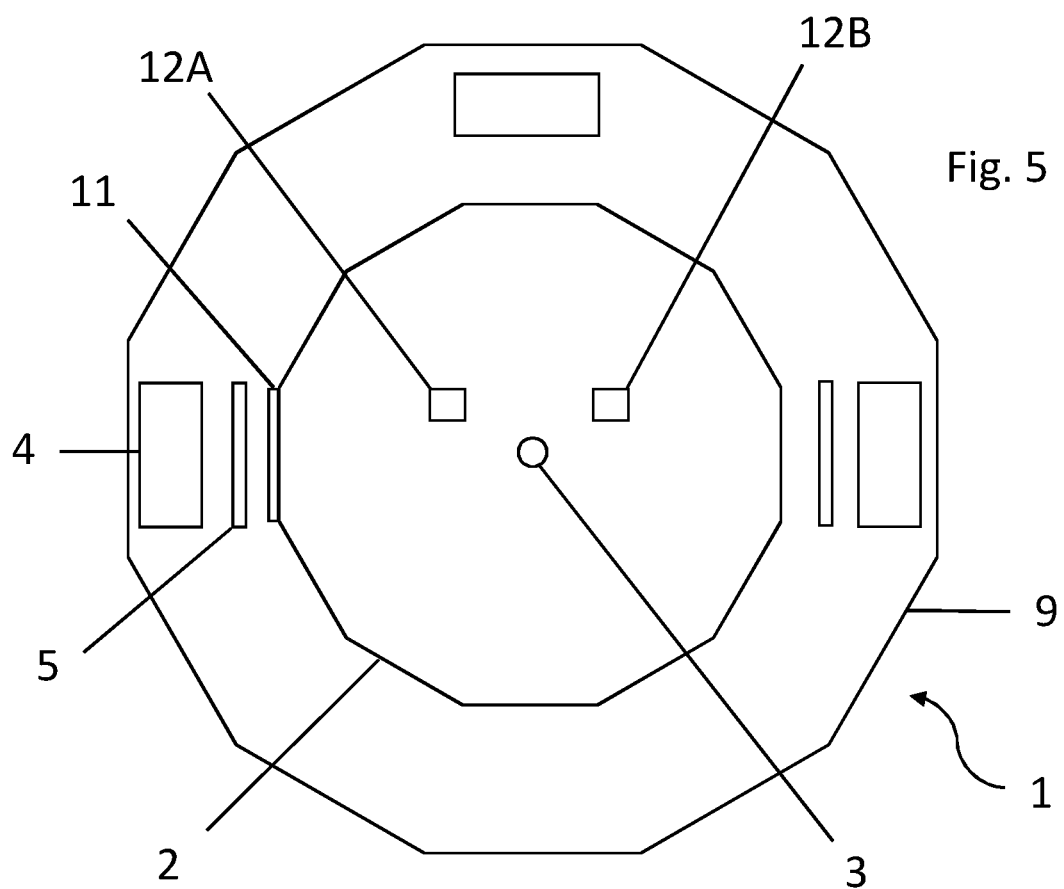

| Test | Method | Specification |
|---|---|---|
| Adhesion | Scotch Tape Test (snap tape removal) | Mil_C_48497A para 4.5.3.1 |
| Humidity | 24hrs, 50ºC, 95 % RH (achieved > 7 days) | Mil_C_48497A para 4.5.3.2 |
| Severe Abrasion | 50 strokes (achieved > 100 strokes) | Mil_C_48497A para 4.5.5.1 |
| Sand wiper test | Requirement 10,000 (achieved > 30,000) | TS1888 para 5.4.3 |
| Salt Spray | Requirement 24hrs (achieved > 200 hrs) | Mil_C_675C para 4.5.9 |

Fig. 6

APPARATUS AND METHODS FOR DEPOSITING DURABLE OPTICAL COATINGS

FIELD OF THE INVENTION

The invention relates to apparatus and methods for depositing germanium and carbon onto one or more substrates.

BACKGROUND TO THE INVENTION

Infra-red (IR) light detectors typically require external optical windows through which IR light may be transmitted. IR-transmissive windows are currently made from materials such as zinc sulphide, germanium and mouldable chalcogenide glass. These materials have the required optical property of transmitting IR light. However, these materials generally exhibit inadequate mechanical properties, such as poor rain or sand erosion resistance, and typically suffer from surface scratching or wear after only light abrasion. IR windows made from such materials are therefore only suitable for use in relatively benign environments and in particular are not suitable for use in harsh environments.

The mechanical properties of IR windows made from materials such as zinc sulphide, germanium or mouldable chalcogenide glass can be improved by applying a hard, stiff and transparent external protective coating. Hard coatings, such as diamond-like carbon (DLC) or germanium carbide ($Ge_xC_{1-x}$), are typically deposited onto IR windows using plasma enhanced chemical vapour deposition (PECVD) at elevated temperatures (e.g. about 300° C.). PECVD is an expensive, low-throughput method, and the elevated temperatures required are incompatible with low-cost chalcogenide glass window materials in particular. PECVD-deposited coatings typically exhibit high residual stresses.

Germanium carbide is a promising hard coating for IR windows, but it is difficult to deposit at low temperatures using known methods.

Accordingly, there is a need for new methods of depositing hard coatings like germanium carbide having higher throughputs while retaining precise control over coating optical properties. In particular, there is a need for methods of depositing such hard coatings at room temperature so as to be compatible with chalcogenide glass IR windows. There is also a need for methods of depositing rugate-structured hard coatings, in which the refractive index of the coating varies continuously through the thickness of the coating.

SUMMARY OF THE INVENTION

A first aspect of the invention provides apparatus for depositing germanium (Ge) and carbon (C) onto one or more substrates. The apparatus comprises a vacuum chamber, at least first and second magnetron sputtering devices and at least one movable mount for supporting the one or more substrates within the vacuum chamber. The first magnetron sputtering device is configured to sputter (i.e. in use) germanium towards the at least one mount from a first sputtering target comprising germanium, thereby defining a germanium sputtering zone within the vacuum chamber. The second magnetron sputtering device is configured to sputter (i.e. in use) carbon towards the at least one mount from a second sputtering target comprising carbon, thereby defining a carbon sputtering zone within the vacuum chamber. The at least one mount and the at least first and second magnetron sputtering devices (i.e. typically including the first and second sputtering targets) are arranged such that, when each substrate is moved through the germanium sputtering zone on the at least one movable mount, germanium is deposited on the said substrate, and when each substrate is moved through the carbon sputtering zone on the at least one movable mount, carbon is deposited on the said substrate.

The first sputtering target typically comprises predominantly germanium. The first sputtering target may consist entirely of germanium. The skilled person will understand that the term 'germanium' does not necessarily refer to 100% pure germanium. The first sputtering target may comprise (e.g. consist of) at least 99.0% pure germanium, or more preferably at least 99.5% pure germanium, or more preferably at least 99.9% pure germanium, or more preferably at least 99.99% pure germanium or more preferably at least 99.999% pure germanium. The first sputtering target may comprise (e.g. consist of) germanium tiles bonded (using, for example, indium) to a copper backing.

The second sputtering target typically comprises predominantly carbon. The second sputtering target may consist entirely of carbon. The skilled person will understand that the term 'carbon' does not necessarily refer to 100% pure carbon. The second sputtering target may comprise (e.g. consist of) at least 99.0% pure carbon, or more preferably at least 99.5% pure carbon, or more preferably at least 99.9% pure carbon, or more preferably at least 99.99% pure carbon, or more preferably at least 99.999% pure carbon. The second sputtering target may comprise (e.g. consist of) carbon in the form of graphite.

The apparatus is typically apparatus for depositing a thin film comprising both germanium and carbon onto the one or more substrates, that is to say a thin film comprising both germanium and carbon atoms. A thin film typically has a thickness (i.e. in a direction substantially perpendicular to the surface of the substrate on which it is formed) of a few nanometers or a few microns, e.g. typically not more than 100 microns.

Thin films comprising germanium and carbon typically transmit infrared light across a broad band of wavelengths and are therefore suitable for use as hard coatings for IR windows. Germanium and carbon may also both be sputtered at low temperatures, e.g. room temperature. Sputtering of germanium and carbon is therefore compatible with the deposition of hard coatings onto, for example, chalcogenide glass substrates. Sputtering at low temperatures also typically results in thin films having low residual stresses (of the order of 100 MPa). Thin films deposited by other methods, such as PECVD, typically exhibit high residual stresses (of the order of 1 GPa), most likely due to the high deposition temperatures required. Because the residual stresses achieved using low-temperature sputtering are low, the inventors have found that the maximum thickness (and thus hardness) of coatings comprising germanium and carbon which can be deposited using the apparatus of this first aspect of the invention is significantly higher than the thickness (and thus hardness) achievable when coatings are deposited using PECVD.

It may be that the apparatus is apparatus for depositing one or more layers of germanium and one or more layers of carbon onto the one or more substrates. It may be that the apparatus is apparatus for depositing one or more monolayers of germanium and one or more monolayers of carbon onto the one or more substrates, wherein a monolayer is one atom thick.

It may be that the apparatus is apparatus for depositing a multi-layered structure onto the one or more substrates, the multi-layered structure comprising one or more layers of germanium and one or more layers of carbon. The multi-layered structure may comprise a plurality of layers of germanium and a plurality of layers of carbon. Each layer of germanium may comprise (e.g. be formed from) one or more monolayers of germanium. Each layer of carbon may comprise (e.g. be formed from) one or more monolayers of carbon. The multi-layered structure may comprise alternating layers of germanium and carbon. Each alternating layer of germanium and carbon may have the same thickness. Alternatively, different layers of germanium and carbon may have different thicknesses.

It may be that the apparatus is apparatus for depositing germanium carbide ($Ge_xC_{1-x}$) onto the one or more substrates. It may be that the apparatus is apparatus for depositing amorphous germanium carbide ($Ge_xC_{1-x}$) onto the one or more substrates. It may be that the apparatus is apparatus for depositing a multi-layered structure onto the one or more substrates, the multi-layered structure comprising one or more layers of $Ge_xC_{1-x}$ and one or more layers of $Ge_yC_{1-y}$, wherein x and y have different values. The multi-layered structure may comprise a plurality of layers of $Ge_xC_{1-x}$ and a plurality of layers of $Ge_yC_{1-y}$. Each layer of $Ge_xC_{1-x}$ may comprise (e.g. be formed from) one or more monolayers of $Ge_xC_{1-x}$. Each layer of $Ge_yC_{1-y}$ may comprise (e.g. be formed from) one or more monolayers of $Ge_yC_{1-y}$. The multi-layered structure may comprise alternating layers of $Ge_xC_{1-x}$ and $Ge_yC_{1-y}$. Each alternating layer of $Ge_xC_{1-x}$ and $Ge_yC_{1-y}$ may have the same thickness. Alternatively, different layers of $Ge_xC_{1-x}$ and $Ge_yC_{1-y}$ may have different thicknesses.

The refractive index of germanium carbide typically depends on the stoichiometric ratio of germanium to carbon. The greater the concentration of germanium, the typically greater the refractive index. A multi-layered structure comprising alternating layers of $Ge_xC_{1-x}$ and $Ge_yC_{1-y}$, wherein x and y have different values, therefore typically has a refractive index which varies (e.g. alternates between at least two different values) spatially along a direction substantially perpendicular to the surface of the one or more substrates onto which the structure is deposited.

It may be that the apparatus is apparatus for depositing a rugate structure onto the one or more substrates. In the rugate structure the composition (e.g. the concentrations of germanium and carbon) varies continuously along the direction substantially perpendicular to the surface of the one or more substrates onto which the structure is deposited. Accordingly, the refractive index typically varies continuously along the direction substantially perpendicular to the surface of the one or more substrates onto which the structure is deposited. Continuous variation in composition also reduces discrete boundaries between regions of different composition within the rugate structure, increasing the mechanical strength of the rugate structure (since any discrete boundaries can act as weak points).

It may be that the apparatus is apparatus for depositing a solid solution comprising germanium and carbon onto the one or more substrates, for example a solid solution of carbon in germanium and/or a solid solution of germanium in carbon.

It may be that the apparatus is apparatus for depositing an anti-reflection coating comprising germanium and carbon onto the one or more substrates. The one or more substrates may be one or more infra-red transmissive windows. The anti-reflection coating is therefore typically an infra-red transmissive anti-reflection coating. The anti-reflection coating may transmit infra-red light having wavelengths in the range 3 μm to 12 μm. The anti-reflection coating may transmit infra-red light having wavelengths in the range 3 μm to 5 μm and/or in the range 8 μm to 12 μm.

The anti-reflection coating is typically an abrasion-resistant anti-reflection coating.

The at least one mount and the at least first and second magnetron sputtering devices (i.e. typically including the first and second sputtering targets) may be arranged such that, when each substrate is moved through the germanium sputtering zone on the at least one movable mount, a layer (e.g. comprising one or more monolayers, for example a single monolayer) of germanium is deposited onto the said substrate.

The at least one mount and the at least first and second magnetron sputtering devices (i.e. typically including the first and second sputtering targets) may be arranged such that, when each substrate is moved through the carbon sputtering zone on the at least one movable mount, a layer (e.g. comprising one or more monolayers, for example a single monolayer) of carbon is deposited onto the said substrate.

The skilled person will understand that by a magnetron sputtering device we mean apparatus adapted for carrying out magnetron sputtering of a sputtering target. Sputtering involves the ejection of particles (e.g. atoms) from a solid sputtering target on bombardment of the said target by energetic particles such as gas ions. In a magnetron sputtering device, an electric field is applied between the target and the substrate onto which material is to be sputtered such that the target functions as a cathode. A plasma is ignited in an inert gas (such as argon) adjacent to the target. An array of magnets (e.g. typically permanent magnets) is arranged around the target to generate a magnetic field which confines the inert gas plasma close to the surface of the target. The electric field accelerates gas ions from the plasma into the surface of the target, resulting in the ejection of uncharged particles from the target, which are subsequently deposited onto the substrate.

At least a portion of the first magnetron sputtering device may be located within the vacuum chamber. For example, the first sputtering target may be located within the vacuum chamber. Alternatively, at least a portion of the first magnetron sputtering device may be provided in fluid communication with the interior of the vacuum chamber such that material (e.g. sputtered germanium) may be transported between the first magnetron sputtering device and the interior of the vacuum chamber (e.g. germanium may be sputtered from the first sputtering target into the vacuum chamber).

At least a portion of the second magnetron sputtering device may be located within the vacuum chamber. For example, the second sputtering target may be located within the vacuum chamber. Alternatively, at least a portion of the second magnetron sputtering device may be provided in fluid communication with the interior of the vacuum chamber such that material (e.g. sputtered carbon) may be transported between the second magnetron sputtering device and the interior of the vacuum chamber (e.g. carbon may be sputtered from the second sputtering target into the vacuum chamber).

The first magnetron sputtering device may be a planar magnetron sputtering device, that is to say the magnetron sputtering device may be configured to generate a (e.g. substantially) planar sputtering plasma adjacent to the first sputtering target (i.e. the plasma may be (e.g. substantially) confined to one plane). The first magnetron sputtering device may be a rectangular (e.g. linear) magnetron sputtering device, that is to say the magnetron sputtering device may be configured to generate a (e.g. substantially) rectangular sputtering plasma adjacent to the first sputtering target (i.e. the plasma may be confined in a plane to a (e.g. substantially) rectangular shape).

The first magnetron sputtering device may be a direct current (DC) magnetron sputtering device. In a DC magnetron sputtering device, the electric field is generated between the sputtering target and the one or more substrates using a DC power source. DC magnetron sputtering is most suitable for sputtering electrically conductive metal targets. Conventional DC magnetron sputtering is less suitable for sputtering dielectric targets where charge build-up on the target due to deposition of plasma ions can lead to excessive arcing in the plasma and poisoning of the target.

Alternatively, the first magnetron sputtering device may be a radio frequency (RF) magnetron sputtering device. In an RF magnetron sputtering device, the electric field is generated between the sputtering target and the one or more substrates using a radio-frequency alternating current (AC) power source. RF magnetron sputtering is suitable for sputtering both metal targets and dielectric targets as plasma ion charges are not able to build up on the target due to the oscillating electric field.

It may be that the first magnetron sputtering device is a pulsed DC magnetron sputtering device, that is to say a DC magnetron sputtering device configured such that the DC electric field is repeatedly pulsed (i.e. switched on and off), or such that the magnitude and polarity of the electric field is varied (e.g. switched), typically at a frequency of between 10 kHz to 350 kHz. Pulsing of the DC electric field repeatedly removes inert gas ions from the surface of the target. Pulsed DC magnetron sputtering is therefore suitable for sputtering both metal and dielectric targets.

The second magnetron sputtering device may be a planar magnetron sputtering device. The second magnetron sputtering device may be a rectangular (e.g. linear) magnetron sputtering device. The second magnetron sputtering device may be a direct current (DC) magnetron sputtering device. The second magnetron sputtering device may be a radio frequency (RF) magnetron sputtering device. It may be that the second magnetron sputtering device is a pulsed DC magnetron sputtering device.

The apparatus is not typically a Closed Field Magnetron (CFM) apparatus. CFM apparatus typically comprises two or more unbalanced magnetron sputtering devices arranged such that neighbouring devices have opposite magnetic polarity. Unbalanced magnetron sputtering devices are devices in which the magnetic field is shaped to permit expansion of plasma away from the target towards the substrate, increasing bombardment of the substrate with plasma ions. In CFM apparatus, magnetic field lines link neighbouring magnetron sputtering devices and thereby trap plasma around the vacuum chamber. It is typically difficult to control the stoichiometry of deposited thin films using CFM apparatus. It is therefore not possible to deposit, for example, rugate structures using CFM apparatus.

Accordingly, the at least first and second magnetron sputtering devices are not typically magnetically linked, i.e. they are not typically linked to one another by magnetic field lines which extend between the said at least first and second magnetron sputtering devices. Plasma generated by the first magnetron sputtering device (i.e. the plasma used to sputter germanium from the first sputtering target) is typically confined to the germanium sputtering zone and plasma generated by the second magnetron sputtering device (i.e. the plasma used to sputter carbon from the second sputtering target) is typically confined to the carbon sputtering zone.

The apparatus typically comprises means for moving (e.g. an actuator configured to move) the at least one mount such that the one or more substrates supported by the said at least one mount are moved (e.g. sequentially and/or repeatedly) through the germanium and/or carbon sputtering zones. For example, it may be that the apparatus comprises means for moving (e.g. an actuator configured to move) at least a portion of the at least one mount through the germanium and/or carbon sputtering zones.

The at least one mount may be rotatable. The apparatus may comprise means for rotating (e.g. an actuator configured to rotate) the at least one mount such that the one or more substrates supported by the said at least one mount are moved (e.g. sequentially and/or repeatedly) through the germanium and/or carbon sputtering zones. For example, it may be that the apparatus comprises means for rotating (e.g. an actuator configured to rotate) the at least one mount such that at least a portion of the at least one mount moves through the germanium and/or carbon sputtering zones.

The at least one mount may be rotatable about a (e.g. substantially) horizontal axis. The at least one mount may be rotatable about an axle extending along the said (e.g. horizontal) axis.

The at least one mount may be a drum. The drum may be (e.g. substantially) prismatic (e.g. cylindrical). The drum may take the shape of a convex regular polygonal prism. The drum may be rotatable about a longitudinal axis thereof (e.g. an axle extending along said longitudinal axis). The drum is typically configured to support the one or more substrates. For example, one or more externally facing walls of the drum may be configured to support the one or more substrates.

It may be that the drum is configured to support one substrate. It may be that one externally facing wall of the drum is configured to support the said one substrate.

It may be that the drum is configured to support two or more substrates. It may be that one externally facing wall of the drum is configured to support the said two or more substrates. Alternatively, it may be that two or more externally facing walls of the drum are configured to support the two or more substrates. It may be that each of the two or more externally facing walls of the drum is configured to support a single corresponding substrate of the one or more substrates.

The apparatus may comprise one or more baffles configured to confine sputtered material within (e.g. each of) the germanium and/or carbon sputtering zones. At least one of the one or more baffles may be located adjacent to the first magnetron sputtering device. At least one of the one or more baffles may be located adjacent to the second magnetron sputtering device. The one or more baffles may extend away from the first and/or second magnetron sputtering devices into the vacuum chamber towards the mount. The one or more baffles may extend away from one or more interior walls of the vacuum chamber towards the mount. The one or more baffles may define external boundaries (e.g. walls) of the germanium and/or carbon sputtering zones. The one or more baffles may restrict (e.g. prevent) sputtered material from escaping from the germanium and/or carbon sputtering zones into the rest of the vacuum chamber. The one or more baffles may restrict (e.g. prevent) particles (e.g. atoms, ions, molecules or molecular fragments) from entering the germanium and/or carbon sputtering zones from the rest of the vacuum chamber.

The germanium sputtering zone and the carbon sputtering zone do not typically overlap. The germanium sputtering zone and the carbon sputtering zone are typically spaced apart from one another within the vacuum chamber.

The first and second magnetron sputtering devices (e.g. the first sputtering target and the second sputtering target) may be located (e.g. diametrically) opposite one another. The first and second magnetron sputtering devices (e.g. the first sputtering target and the second sputtering target) may be located on (e.g. diametrically) opposing sides of the vacuum chamber.

The apparatus may comprise at least one plasma processing device. The at least one plasma processing device typically comprises a source of plasma. The source of plasma typically comprises a source of gas (i.e. a source of gas atoms and/or molecules) and means for igniting a plasma within the gas. The gas may be an inert gas (such as argon (Ar)). The at least one plasma processing device may be a microwave plasma device, that is to say that the means for igniting the plasma may comprise a source of microwave radiation.

The at least one plasma processing device may be configured (e.g. arranged) to direct the plasma towards the at least one mount, thereby defining a plasma treatment zone within the vacuum chamber. The means for moving (e.g. the actuator configured to move) the at least one mount, or the means for rotating (e.g. the actuator configured to rotate) the at least one mount, may be configured to move (i.e. in use) the one or more substrates through the plasma treatment zone.

Gas ions may be deposited on the one or more substrates moved through the plasma treatment zone. Gas ions may react with the one or more substrates moved through the plasma treatment zone. Gas ions may react with one or more layers of material located on the one or more substrates moved through the plasma treatment zone.

Plasma treatment typically enhances durability of the material (i.e. the germanium and carbon) deposited onto the one or more substrates.

It may be that the gas supplied by the plasma processing device comprises hydrogen and that the plasma processing device directs hydrogen ions towards the mount, thereby defining a plasma hydrogenation zone within the vacuum chamber. It may be that movement of the one or more substrates through the plasma hydrogenation zone results in hydrogenation of one or more layers of material located on the said one or more substrates.

The means for moving (e.g. the actuator configured to move) the at least one mount, or the means for rotating (e.g. the actuator configured to rotate) the at least one mount, may be configured to move (i.e. in use) the one or more substrates sequentially through the germanium sputtering zone and the plasma treatment zone (e.g. the plasma hydrogenation zone). The means for moving (e.g. the actuator configured to move) the at least one mount, or the means for rotating (e.g. the actuator configured to rotate) the at least one mount, may be configured to move the one or more substrates sequentially through the carbon sputtering zone and the plasma treatment zone (e.g. the plasma hydrogenation zone). The means for moving (e.g. the actuator configured to move) the at least one mount, or the means for rotating (e.g. the actuator configured to rotate) the at least one mount, may be configured to move the one or more substrates sequentially through the germanium sputtering zone, the carbon sputtering zone and the plasma treatment zone (e.g. the plasma hydrogenation zone).

Plasma-assisted hydrogenation allows substantially higher hydrogenation rates to be achieved than hydrogenation by other methods. Hydrogenation typically reduces the number of dangling bonds in the deposited material, thereby reducing optical absorption. Hydrogen plasma can also be used to clean the first and second target surfaces during deposition, thereby reducing the level of dust on the target surfaces and resultant contamination of the one or more substrates. Hydrogen plasma can be used to pre-clean the one or more substrates prior to deposition of the thin film comprising germanium and carbon.

The one or more substrates may be one or more glass substrates. The one or more substrates may be one or more borosilicate glass substrates (e.g. formed from BK7 glass). The one or more substrates may be one or more zinc sulphide substrates. The one or more substrates may be one or more germanium substrates. The one or more substrates may be one or more chalcogenide substrates (e.g. formed from chalcogenide glass such as germanium-sulphide (Ge—S) glass).

The apparatus may comprise at least one deposition sensor.

The at least one deposition sensor may be configured (e.g. calibrated) to measure a parameter indicative of the amount of material deposited onto a sensing surface of the said deposition sensor. Additionally or alternatively, the at least one deposition sensor may be configured (e.g. calibrated) to measure a parameter indicative of the rate at which material is deposited onto the sensing surface of the said deposition sensor.

The at least one deposition sensor may be configured (e.g. calibrated) to measure a parameter indicative of the amount of germanium and/or carbon (i.e. germanium and/or carbon sputtered from the first and/or second sputtering targets) which is deposited onto the said sensing surface. The at least one deposition sensor may be configured (e.g. calibrated) to measure a parameter indicative of the rate at which germanium and/or carbon (i.e. germanium and/or carbon sputtered from the first and/or second sputtering targets) is deposited onto the said sensing surface.

The at least one deposition sensor may be configured (e.g. calibrated) to measure a parameter indicative of the amount of material which is deposited onto the one or more substrates. The at least one deposition sensor may be configured (e.g. calibrated) to measure a parameter indicative of the rate at which material is deposited onto the one or more substrates.

The at least one deposition sensor may be configured (e.g. calibrated) to measure a parameter indicative of the amount of germanium and/or carbon (i.e. germanium and/or carbon sputtered from the first and/or second sputtering targets) which is deposited onto the said sensing surface. The at least one deposition sensor may be configured (e.g. calibrated) to measure a parameter indicative of the rate at which germanium and/or carbon (i.e. germanium and/or carbon sputtered from the first and/or second sputtering targets) is deposited onto the said sensing surface.

The apparatus may comprise a controller configured to receive measurements of the said parameter (i.e. the parameter indicative of the amount of material (e.g. germanium and/or carbon) deposited or the rate at which material (e.g. germanium and/or carbon) is deposited onto a sensing surface and/or the parameter indicative of the amount of material (e.g. germanium and/or carbon) deposited or the rate at which material (e.g. germanium and/or carbon) is deposited onto the one or more substrates) from the at least one deposition sensor. The controller may be configured to cause a change in the movement of the at least one movable mount responsive to the received measurements. The controller may be configured to cause a change in the speed of the movement of the at least one movable mount responsive to the received measurements. The controller may be configured to cause a change in the speed of rotation of the at least one movable mount responsive to the received measurements. The controller may be configured to cause a change in the intensity of sputtering at the first magnetron sputtering device and/or the second magnetron sputtering device responsive to the received measurements. The controller may be configured to cause a change in the amount of power supplied to the first magnetron sputtering device and/or the second magnetron sputtering device responsive to the said received measurements. The controller may be configured to switch the first and/or second magnetron sputtering devices on or off responsive to the received measurements.

The apparatus may comprise a first deposition sensor and a second deposition sensor. The first deposition sensor may be configured to measure a first parameter indicative of the amount of germanium (and/or the rate at which germanium is) deposited onto a sensing surface of the said first deposition sensor from the first magnetron sputtering device and/or the amount of germanium (and/or the rate at which germanium is) deposited onto the one or more substrates. The second deposition sensor may be configured to measure a second parameter indicative of the amount of carbon (and/or the rate at which carbon is) deposited onto a sensing surface of the said second deposition sensor from the second magnetron sputtering device and/or the amount of carbon (and/or the rate at which carbon is) deposited onto the one or more substrates. The apparatus may comprise a controller configured to receive measurements of the first parameter from the first deposition sensor and measurements of the second parameter from the second deposition sensor. The controller may be configured to cause a change in the movement of the at least one movable mount (e.g. the speed of the movement of the at least one movable mount, for example the speed of rotation of the at least one movable mount) and/or the intensity of sputtering at the first magnetron sputtering device and/or the second magnetron sputtering device (e.g. the amount of power supplied to the first magnetron sputtering device and/or the second magnetron sputtering device) responsive to the said received measurements of the first parameter and/or the second parameter.

For example, in use, the first magnetron sputtering device may be used to deposit germanium onto the one or more substrates moved through the germanium sputtering zone and the second magnetron sputtering device may be switched off. As the one or more substrates are moved repeatedly through the germanium sputtering zone, a layer of germanium may be deposited onto the said one or more substrates one or more monolayers at a time. Germanium may also be deposited onto the sensing surface of the first deposition sensor, but only when germanium is deposited onto the one or more substrates. The first deposition sensor may measure a parameter indicative of the amount of germanium deposited onto the sensing surface (and/or the rate of deposition of germanium onto the sensing surface), the said parameter also being indicative of the amount of material deposited onto the one or more substrates (and/or the rate of deposition of germanium onto the one or more substrates). The controller may receive the parameter measured by the first deposition sensor and thereby calculate the thickness of the layer of germanium which has been deposited onto the one or more substrates. When the calculated thickness reaches a predefined desired germanium layer thickness, the controller may switch off the first magnetron sputtering device and switch on the second magnetron sputtering device. As the one or more substrates are moved repeatedly through the carbon sputtering zone, a layer of carbon may be deposited onto the layer of germanium already deposited on the one or more substrates. Carbon may also be deposited onto the sensing surface of the second deposition sensor, but only when carbon is deposited onto the one or more substrates. The second deposition sensor may measure a parameter indicative of the amount of carbon deposited onto the sensing surface (and/or the rate of deposition of carbon onto the sensing surface), the said parameter also being indicative of the amount of carbon deposited onto the one or more substrates (and/or the rate of deposition of carbon onto the one or more substrates). The controller may receive the parameter measured by the second deposition sensor and thereby calculate the thickness of the layer of carbon which has been deposited onto the one or more substrates. When the calculated thickness reaches a predefined desired carbon layer thickness, the controller may switch off the second magnetron sputtering device. The process may be repeated to build up alternating layers of germanium and carbon on the one or more substrates with accurately controlled thicknesses.

In alternative uses, both the first and second magnetron sputtering devices may be switched on and the one or more substrates may be repeatedly and sequentially moved through the germanium and carbon sputtering zones. As the one or more substrates are moved through the germanium sputtering zone, germanium may be deposited onto the one or more substrates and onto the sensing surface of the first deposition sensor. As the one or more substrates are moved through the carbon sputtering zone, carbon may be deposited onto the one or more substrates and onto the sensing surface of the second deposition sensor. The amount of germanium and/or carbon deposited onto the one or more substrates each time the said one or more substrates pass through the germanium and/or carbon sputtering zones is typically dependent on the speed of movement of the one or more substrates and the power supplied to the first and/or second magnetron sputtering devices. The controller may therefore vary the speed of movement of the one or more substrates, or the power supplied to the first and/or second magnetron sputtering devices, responsive to parameters measured by the first and/or second deposition sensors, to control the quantity of germanium and/or carbon deposited onto the one or more substrates during each pass through the germanium and/or carbon sputtering zones. Accordingly, germanium carbide ($Ge_xC_{1-x}$) or a solid solution of germanium in carbon or carbon in germanium may be deposited with fine stoichiometric control. Since the speed of movement or the power supplied to the first and/or second magnetron sputtering devices can be varied during the deposition process, thin films may be deposited in which the composition (e.g. the concentration of carbon and/or germanium) varies, such as along a direction perpendicular to the surface of the one or more substrates onto which the material is deposited. Rugate thin films may therefore be deposited.

The apparatus may comprise two or more deposition sensors (e.g. three depositions sensors) per magnetron sputtering device. Use of two or more (e.g. three) deposition sensors per magnetron sputtering device results in a more accurate determination of the amount of material deposited and/or the rate of deposition of material, and allows the apparatus to continue functioning even if one or more deposition sensors fail during use.

The at least one deposition sensor (e.g. the first and/or second deposition sensors) may (e.g. each) comprise a microbalance (e.g. a quartz crystal microbalance). The microbalance (e.g. the quartz crystal microbalance) is typically configured to measure a parameter indicative of the resonant frequency of an acoustic resonator (e.g. a quartz crystal resonator). The resonant frequency of the acoustic resonator (e.g. the quartz crystal resonator) typically depends sensitively on the mass of the said acoustic resonator (e.g. the quartz crystal resonator). Accordingly, small changes in mass of the acoustic resonator (e.g. the quartz crystal resonator) due to deposition of material onto the said acoustic resonator (e.g. onto the quartz crystal resonator) which result in changes to the resonant frequency are typically measured by the microbalance. The time dependence of the resonant frequency measured by the microbalance is typically indicative of the rate of deposition of material onto the acoustic resonator (e.g. onto the quartz crystal resonator).

The at least one deposition sensor may be calibrated by measuring a change in the resonant frequency of the acoustic resonator (e.g. the quartz crystal resonator) as single layers (i.e. monolayers) of carbon and/or germanium are deposited onto the sensing surface (i.e. onto the quartz crystal). The at least one deposition sensor may be calibrated by measuring a change in the resonant frequency of the acoustic resonator (e.g. the quartz crystal resonator) as symmetric multilayers of carbon and germanium are deposited onto the sensing surface (i.e. onto the quartz crystal). Symmetric multilayers have spectral characteristics which are sensitive to an imbalance in high- and low-refractive index materials, allowing the amount of material deposited to be determined accurately using spectroscopic techniques, which is then used to calibrate the at least one deposition sensor.

The at least one deposition sensor (e.g. the first and/or second deposition sensor) may be static. The at least one deposition sensor (e.g. the first and/or second deposition sensor) may be (e.g. fixedly) mounted within the vacuum chamber. The at least one deposition sensor (e.g. the first and/or second deposition sensor) may form part of the first and/or second magnetron sputtering devices.

The at least one deposition sensor (e.g. the first and/or second deposition sensor) may be attached to (e.g. fixedly attached to) the movable mount. The at least one deposition sensor (e.g. the first and/or second deposition sensor) may move with the movable mount.

The at least one deposition sensor (e.g. the first and/or second deposition sensor) may be mounted within the drum. One or more apertures may be provided in the drum. The one or more apertures may be located directly between the at least one deposition sensor (e.g. the first and/or second deposition sensor) and the first and/or second magnetron sputtering devices, such that (i.e. some of the) material sputtered by the first and/or second magnetron sputtering devices reaches and is deposited on the at least one deposition sensor (e.g. the first and/or second deposition sensor), i.e. the one or more apertures are located on a direct line of sight between the at least one deposition sensor (e.g. the first and/or second deposition sensor) and the first and/or second magnetron sputtering devices. The one or more apertures may extend around a circumference of the drum. Alternatively, the one or more apertures may be spaced out around the circumference of the drum (i.e. such that there is solid material forming the drum between each aperture). It may be that the drum is prismatic and comprises a plurality of external faces onto which the one or more substrates may be mounted, and that the one or more apertures are located around the drum on alternate external faces. It may be that, as the drum rotates, (i.e. some of the) material sputtered by the first and/or second magnetron sputtering devices reaches and is deposited onto the at least one deposition sensor (e.g. the first and/or second deposition sensor) when the one or more apertures are provided directly between the at least one deposition sensor (e.g. the first and/or second deposition sensor) and the first and/or second magnetron sputtering devices, and that material sputtered by the first and/or second magnetron sputtering devices is prevented from being deposited onto the at least one deposition sensor (e.g. the first and/or second deposition sensor) when the one or more apertures rotated out of alignment with the first and/or second magnetron sputtering devices.

It may be that a first sputtering mask is located between the first sputtering target and the at least one mount.

The first sputtering mask may be configured (e.g. shaped) such that (i.e. in use), when each substrate is moved through the germanium sputtering zone on the at least one movable mount, a layer of germanium having a uniform thickness is deposited on each said substrate. The skilled person will understand that a layer of material having a uniform thickness means that the thickness of the layer of material is substantially constant across the said layer.

The first sputtering mask may be configured (e.g. shaped) such that (i.e. in use), when each substrate is moved through the germanium sputtering zone on the at least one movable mount, a layer of germanium having a non-uniform thickness is deposited on each said substrate. The skilled person will understand that a layer of material having a non-uniform thickness means that the thickness of the layer of material varies spatially (i.e. with location) across the said layer.

It may be that a second sputtering mask is located between the second sputtering target and the at least one mount. The second sputtering mask may be configured (e.g. shaped) such that (i.e. in use), when each substrate is moved through the carbon sputtering zone on the at least one movable mount, a layer of carbon having a uniform thickness is deposited on each said substrate. The second sputtering mask may be configured (e.g. shaped) such that (i.e. in use), when each substrate is moved through the carbon sputtering zone on the at least one movable mount, a layer of carbon having a non-uniform thickness is deposited on each said substrate.

A second aspect of the invention provides a method for depositing germanium (Ge) and carbon (C) onto one or more substrates. The method comprises: at least one first magnetron sputtering device sputtering germanium from a first sputtering target comprising germanium to thereby define a germanium sputtering zone within a vacuum chamber; at least one mount moving the one or more substrates through the germanium sputtering zone so that germanium is deposited on each said substrate; at least one second magnetron sputtering device sputtering carbon from a second sputtering target comprising carbon to thereby define a carbon sputtering zone within the vacuum chamber; the at least one mount moving the one or more substrates through the carbon sputtering zone so that carbon is deposited on each said substrate.

The method is typically a method for depositing a thin film comprising both germanium and carbon onto the one or more substrates, that is to say a thin film comprising both germanium and carbon atoms.

It may be that the method is a method for depositing one or more layers of germanium and one or more layers of carbon onto the one or more substrates. It may be that the method is a method for depositing one or more monolayers of germanium and one or more monolayers of carbon onto the one or more substrates, wherein a monolayer is one atom thick.

It may be that the method is a method for depositing a multi-layered structure onto the one or more substrates, the multi-layered structure comprising one or more layers of germanium and one or more layers of carbon. The multi-layered structure may comprise a plurality of layers of germanium and a plurality of layers of carbon. Each layer of germanium may comprise (e.g. be formed from) one or more monolayers of germanium. Each layer of carbon may comprise (e.g. be formed from) one or more monolayers of carbon. The multi-layered structure may comprise alternating layers of germanium and carbon. Each alternating layer of germanium and carbon may have the same thickness. Alternatively, different layers of germanium and carbon may have different thicknesses.

It may be that the method is a method for depositing germanium carbide ($Ge_xC_{1-x}$) onto the one or more substrates. It may be that the method is a method for depositing amorphous germanium carbide ($Ge_xC_{1-x}$) onto the one or more substrates. It may be that the method is a method for depositing a multi-layered structure onto the one or more substrates, the multi-layered structure comprising one or more layers of $Ge_xC_{1-x}$ and one or more layers of $Ge_yC_{1-y}$, wherein x and y have different values.

It may be that the method is a method for depositing a rugate structure onto the one or more substrates. In the rugate structure the composition (e.g. the concentrations of germanium and carbon) varies continuously along the direction substantially perpendicular to the surface of the one or more substrates onto which the structure is deposited. Accordingly, the refractive index typically varies continuously along the direction substantially perpendicular to the surface of the one or more substrates onto which the structure is deposited.

It may be that the apparatus is apparatus for depositing a solid solution comprising germanium and carbon onto the one or more substrates, for example a solid solution of carbon in germanium and/or a solid solution of germanium in carbon.

The at least one mount and the at least first and second magnetron sputtering devices (i.e. typically including the first and second sputtering targets) may be arranged such that the at least one mount moving each substrate through the germanium sputtering zone results in (i.e. causes) a layer (e.g. comprising one or more monolayers, for example a single monolayer) of germanium to be deposited onto the said substrate.

The at least one mount and the at least first and second magnetron sputtering devices (i.e. typically including the first and second sputtering targets) may be arranged such that the at least one mount moving each substrate through the carbon sputtering zone results in (i.e. causes) a layer (e.g. comprising one or more monolayers, for example a single monolayer) of carbon to be deposited onto the said substrate.

The method may comprise providing at least a portion of the first magnetron sputtering device within the vacuum chamber. For example, the method may comprise providing the first sputtering target within the vacuum chamber. Alternatively, the method may comprise providing at least a portion of the first magnetron sputtering device in fluid communication with the interior of the vacuum chamber such that material (e.g. sputtered germanium) may be transported between the first magnetron sputtering device and the interior of the vacuum chamber (e.g. germanium may be sputtered from the first sputtering target into the vacuum chamber).

The method may comprise providing at least a portion of the second magnetron sputtering device within the vacuum chamber. For example, the method may comprise providing the second sputtering target within the vacuum chamber. Alternatively, the method may comprise providing at least a portion of the second magnetron sputtering device in fluid communication with the interior of the vacuum chamber such that material (e.g. sputtered carbon) may be transported between the second magnetron sputtering device and the interior of the vacuum chamber (e.g. carbon may be sputtered from the second sputtering target into the vacuum chamber).

The first magnetron sputtering device may be a planar magnetron sputtering device. The first magnetron sputtering device may be a rectangular (e.g. linear) magnetron sputtering device. The first magnetron sputtering device may be a direct current (DC) magnetron sputtering device. The first magnetron sputtering device may be a radio frequency (RF) magnetron sputtering device. It may be that the first magnetron sputtering device is a pulsed DC magnetron sputtering device.

The second magnetron sputtering device may be a planar magnetron sputtering device. The second magnetron sputtering device may be a rectangular (e.g. linear) magnetron sputtering device. The second magnetron sputtering device may be a direct current (DC) magnetron sputtering device. The second magnetron sputtering device may be a radio frequency (RF) magnetron sputtering device. It may be that the second magnetron sputtering device is a pulsed DC magnetron sputtering device.

The at least one mount may be rotatable. The method may comprise rotating the at least one mount and thereby moving the one or more substrates (i.e. supported by the said at least one mount) through the germanium and/or carbon sputtering zones.

The method may comprise rotating the at least one mount about a (e.g. substantially) horizontal axis. The method may comprise rotating the at least one mount about an axle extending along the said (e.g. horizontal) axis.

The at least one mount may be a drum. The drum may be (e.g. substantially) prismatic (e.g. cylindrical). The drum may take the shape of a convex regular polygonal prism. The drum may be rotatable about a longitudinal axis thereof (e.g. an axle extending along said longitudinal axis). The drum is typically configured to support the one or more substrates. For example, one or more externally facing walls of the drum may be configured to support the one or more substrates.

It may be that the drum is configured to support one substrate. It may be that one externally facing wall of the drum is configured to support the said one substrate.

It may be that the drum is configured to support two or more substrates. It may be that one externally facing wall of the drum is configured to support the said two or more substrates. Alternatively, it may be that two or more externally facing walls of the drum are configured to support the two or more substrates. It may be that each of the two or more externally facing walls of the drum is configured to support a single corresponding substrate of the one or more substrates.

The method may comprise confining sputtered material within (e.g. each of) the germanium and/or carbon sputtering zones (for example, by way of one or more baffles). At least one of the one or more baffles may be located adjacent to the first magnetron sputtering device. At least one of the one or more baffles may be located adjacent to the second magnetron sputtering device. The one or more baffles may extend away from the first and/or second magnetron sputtering devices into the vacuum chamber towards the mount. The one or more baffles may extend away from one or more interior walls of the vacuum chamber towards the mount. The one or more baffles may define external boundaries (e.g. walls) of the germanium and/or carbon sputtering zones. The method may comprise restricting (e.g. preventing) sputtered material from escaping from the germanium and/or carbon sputtering zones into the rest of the vacuum chamber. The method may comprise restricting (e.g. preventing) particles (e.g. atoms, ions, molecules or molecular fragments) from entering the germanium and/or carbon sputtering zones from the rest of the vacuum chamber.

The germanium sputtering zone and the carbon sputtering zone do not typically overlap. The germanium sputtering zone and the carbon sputtering zone are typically spaced apart from one another within the vacuum chamber.

The method may comprise exposing the one or more substrates to plasma. The method may comprise at least one plasma processing device exposing the one or more substrates to plasma. The at least one plasma processing device typically comprises a source of plasma. The source of plasma typically comprises a source of gas (i.e. a source of gas atoms and/or molecules) and means for igniting a plasma within the gas. The gas may be an inert gas (such as argon (Ar)). The at least one plasma processing device may be a microwave plasma device, that is to say that the means for igniting the plasma may comprise a source of microwave radiation.

The method may comprise (i.e. the at least one plasma processing device) directing plasma towards the at least one mount, thereby defining a plasma treatment zone within the vacuum chamber. The method may comprise moving the one or more substrates (e.g. the at least one mount moving the one or more substrates) through the plasma treatment zone.

Gas ions may be deposited on one or more substrates moved through the plasma treatment zone. Gas ions may react with one or more substrates moved through the plasma treatment zone. Gas ions may react with one or more layers of material located on the one or more substrates moved through the plasma treatment zone.

Plasma treatment typically enhances durability of the germanium and carbon deposited onto the one or more substrates.

It may be that the gas supplied by the at least one plasma processing device comprises hydrogen and that the method comprises the at least one plasma processing device directing hydrogen ions towards the mount, thereby defining a plasma hydrogenation zone within the vacuum chamber. It may be that the method comprises moving the one or more substrates (e.g. the at least one mount moving the one or more substrates) through the plasma hydrogenation zone. Movement of the one or more substrates through the plasma hydrogenation zone typically results in hydrogenation of one or more layers of material located on the said one or more substrates.

The method may comprise moving the one or more substrates (e.g. the at least one mount moving the one or more substrates) sequentially through the germanium sputtering zone and the plasma treatment zone (e.g. the plasma hydrogenation zone). The method may comprise moving the one or more substrates (e.g. the at least one mount moving the one or more substrates) sequentially the carbon sputtering zone and through the plasma treatment zone (e.g. the plasma hydrogenation zone). The method may comprise moving the one or more substrates (e.g. the at least one mount moving the one or more substrates) sequentially through the germanium sputtering zone, the carbon sputtering zone and the plasma treatment zone (e.g. the plasma hydrogenation zone).

The method may comprise at least one deposition sensor measuring a parameter indicative of the amount of material deposited onto a sensing surface of the said deposition sensor. The method may comprise at least one deposition sensor measuring a parameter indicative of the rate at which material is deposited onto a sensing surface of the said deposition sensor.

The method may comprise the at least one deposition sensor measuring a parameter indicative of the amount of germanium and/or carbon (i.e. germanium and/or carbon sputtered from the first and/or second sputtering targets) deposited onto the said sensing surface. The method may comprise the at least one deposition sensor measuring a parameter indicative of the rate at which germanium and/or carbon (i.e. germanium and/or carbon sputtered from the first and/or second sputtering targets) is deposited onto the said sensing surface.

The method may comprise the at least one deposition sensor measuring a parameter indicative of the amount of material deposited onto the one or more substrates. The method may comprise the at least one deposition sensor measuring a parameter indicative of the rate at which material is deposited onto the one or more substrates.

The method may comprise the at least one deposition sensor measuring a parameter indicative of the amount of germanium and/or carbon (i.e. germanium and/or carbon sputtered from the first and/or second sputtering targets) deposited onto the one or more substrates. The method may comprise the at least one deposition sensor measuring a parameter indicative of the rate at which germanium and/or carbon (i.e. germanium and/or carbon sputtered from the first and/or second sputtering targets) is deposited onto the one or more substrates.

The method may comprise a controller receiving measurements of the said parameter (i.e. the parameter indicative of the amount of material (e.g. germanium and/or carbon) deposited and/or the rate at which material (e.g. germanium and/or carbon) is deposited onto a sensing surface and/or the one or more substrates) from the at least one deposition sensor. The method may comprise the controller causing a change in the movement of the at least one movable mount responsive to the received measurements. The method may comprise the controller causing a change in the speed of the movement of the at least one movable mount responsive to the received measurements. The method may comprise the controller causing a change in the speed of rotation of the at least one movable mount responsive to the received measurements. The method may comprise the controller causing a change in the intensity of sputtering at the first magnetron sputtering device and/or the second magnetron sputtering device responsive to the received measurements. The method may comprise the controller causing a change in the amount of power supplied to the first magnetron sputtering device and/or the second magnetron sputtering device responsive to the said received measurements. The method may comprise the controller switching the first and/or second magnetron sputtering devices on or off responsive to the received measurements.

The method may comprise a first deposition sensor measuring a first parameter indicative of the amount of germanium deposited (and/or the rate at which germanium is deposited) onto a sensing surface of the said first deposition sensor from the first magnetron sputtering device and/or the amount of germanium deposited (and/or the rate at which germanium is deposited) onto the one or more substrates. The method may comprise a second deposition sensor measuring a second parameter indicative of the amount of carbon deposited (and/or the rate at which carbon is deposited) onto a sensing surface of the said second deposition sensor from the second magnetron sputtering device and/or the amount of carbon deposited (and/or the rate at which carbon is deposited) onto the one or more substrates. The method may comprise a controller receiving measurements of the first parameter from the first deposition sensor and measurements of the second parameter from the second deposition sensor. The method may comprise the controller causing a change in the movement of the at least one movable mount (e.g. the speed of the movement of the at least one movable mount, for example the speed of rotation of the at least one movable mount) and/or the intensity of sputtering at the first magnetron sputtering device and/or the second magnetron sputtering device (e.g. the amount of power supplied to the first magnetron sputtering device and/or the second magnetron sputtering device) responsive to the said received measurements of the first parameter and/or the second parameter.

The at least one deposition sensor (e.g. the first and/or second deposition sensors) may (e.g. each) comprise a microbalance (e.g. a quartz crystal microbalance). The method may comprise the microbalance (e.g. the quartz crystal microbalance) measuring a parameter indicative of the resonant frequency of an acoustic resonator (e.g. a quartz crystal resonator).

The method may comprise calibrating the at least one deposition sensor (e.g. the microbalance). Calibrating the at least one deposition sensor may comprise measuring a change in the resonant frequency of the acoustic resonator (e.g. the quartz crystal resonator) as single layers (i.e. monolayers) of carbon and/or germanium are deposited onto the sensing surface (i.e. onto the quartz crystal). Calibrating the at least one deposition sensor may comprise measuring a change in the resonant frequency of the acoustic resonator (e.g. the quartz crystal resonator) as symmetric multilayers of carbon and germanium are deposited onto the sensing surface (i.e. onto the quartz crystal).

The at least one deposition sensor (e.g. the first and/or second deposition sensor) may be static (i.e. the position of the at least one deposition sensor may be fixed). The at least one deposition sensor (e.g. the first and/or second deposition sensor) may be (e.g. fixedly) mounted within the vacuum chamber. The at least one deposition sensor (e.g. the first and/or second deposition sensor) may form part of the first and/or second magnetron sputtering devices.

The at least one deposition sensor (e.g. the first and/or second deposition sensor) may be attached to (e.g. fixedly attached to) the movable mount. The at least one deposition sensor (e.g. the first and/or second deposition sensor) may move with the movable mount.

The at least one deposition sensor (e.g. the first and/or second deposition sensor) may be mounted within the drum. One or more apertures may be provided in the drum. The one or more apertures may be located directly between the at least one deposition sensor (e.g. the first and/or second deposition sensor) and the first and/or second magnetron sputtering devices, such that (i.e. some of the) material sputtered by the first and/or second magnetron sputtering devices reaches and is deposited on the at least one deposition sensor (e.g. the first and/or second deposition sensor), i.e. the one or more apertures are located on a direct line of sight between the at least one deposition sensor (e.g. the first and/or second deposition sensor) and the first and/or second magnetron sputtering devices. The one or more apertures may extend around a circumference of the drum. Alternatively, the one or more apertures may be spaced out around the circumference of the drum (i.e. such that there is solid material forming the drum between each aperture). It may be that the drum is prismatic and comprises a plurality of external faces onto which the one or more substrates may be mounted, and that the one or more apertures are located around the drum on alternate external faces. It may be that, as the drum rotates, (i.e. some of the) material sputtered by the first and/or second magnetron sputtering devices reaches and is deposited onto the at least one deposition sensor (e.g. the first and/or second deposition sensor) when the one or more apertures are provided directly between the at least one deposition sensor (e.g. the first and/or second deposition sensor) and the first and/or second magnetron sputtering devices, and that material sputtered by the first and/or second magnetron sputtering devices is prevented from being deposited onto the at least one deposition sensor (e.g. the first and/or second deposition sensor) when the one or more apertures rotates out of alignment with the first and/or second magnetron sputtering devices.

The method may comprise providing a first sputtering mask between the first sputtering target and the at least one mount.

The first sputtering mask may be configured (e.g. shaped) such that (i.e. in use), when each substrate is moved through the germanium sputtering zone on the at least one movable mount, a layer of germanium having a uniform thickness is deposited on each said substrate.

The first sputtering mask may be configured (e.g. shaped) such that (i.e. in use), when each substrate is moved through the germanium sputtering zone on the at least one movable mount, a layer of germanium having a non-uniform thickness is deposited on each said substrate.

The method may comprise providing a second sputtering mask between the second sputtering target and the at least one mount. The second sputtering mask may be configured (e.g. shaped) such that (i.e. in use), when each substrate is moved through the carbon sputtering zone on the at least one movable mount, a layer of carbon having a uniform thickness is deposited on each said substrate. The second sputtering mask may be configured (e.g. shaped) such that (i.e. in use), when each substrate is moved through the carbon sputtering zone on the at least one movable mount, a layer of carbon having a non-uniform thickness is deposited on each said substrate.

The one or more substrates may be one or more glass substrates. The one or more substrates may be one or more borosilicate glass substrates (e.g. formed from BK7 glass). The one or more substrates may be one or more zinc sulphide substrates. The one or more substrates may be one or more germanium substrates. The one or more substrates may be one or more chalcogenide substrates (e.g. formed from chalcogenide glass such as germanium-sulphide (Ge—S) glass).

The method is typically carried out at room temperature.

A third aspect of the invention provides an optical device comprising a substrate and a thin film, comprising germanium and carbon, deposited thereon by a method according to the second aspect of the invention.

The thin film may comprise one or more layers (e.g. one or more monolayers) of germanium and one or more layers (e.g. one or more monolayers) of carbon. The thin film may have a multi-layered structure comprising a plurality of layers (e.g. monolayers) of germanium and a plurality of layers (e.g. monolayers) of carbon. The multi-layered structure may comprise alternating layers (e.g. monolayers) of germanium and carbon.

The thin film may comprise germanium carbide ($Ge_xC_{1-x}$) (e.g. amorphous germanium carbide ($Ge_xC_{1-x}$)). The thin film may comprise a multi-layered structure comprising one or more layers (e.g. one or more monolayers) of $Ge_xC_{1-x}$ and one or more layers (e.g. one or more monolayers) of $Ge_yC_{1-y}$, wherein x and y have different values.

The thin film may have a rugate structure comprising germanium and carbon, i.e. a structure in which the composition (e.g. the concentrations of germanium and carbon) varies continuously along a direction substantially perpendicular to the surface of the substrate onto which the thin film is deposited.

It may be that the substrate comprises an infra-red transmissive optical region (e.g. an infra-red transmissive optical window).

The substrate (e.g. the infra-red transmissive optical region) may comprise (e.g. be formed from) one or more of the following: borosilicate (e.g. borosilicate glass, for example BK7 glass), zinc sulphide, germanium, chalcogenide (e.g. chalcogenide glass, for example germanium-sulphide (Ge—S) glass).

Optional and preferred features of any one aspect of the invention may be features of any other aspect of the invention.

DESCRIPTION OF THE DRAWINGS

An example embodiment of the present invention will now be illustrated with reference to the following Figures in which:

FIG. 3 shows the deposition apparatus of FIG. 1 with the substrate positioned in front of a microwave plasma source;

FIG. 4 shows the deposition apparatus of FIG. 1 with a substrate positioned in front of a second pulsed DC magnetron sputtering source provided with a carbon target;

FIG. 5 shows the deposition apparatus of FIG. 1 provided with first and second quartz crystal microbalance deposition rate sensors;

FIG. 6 is a table of test results for a 1 µm thick film of stoichiometric germanium carbide as deposited on germanium, zinc selenide and chalcogenide substrates;

DETAILED DESCRIPTION OF AN EXAMPLE EMBODIMENT

Figure 1:
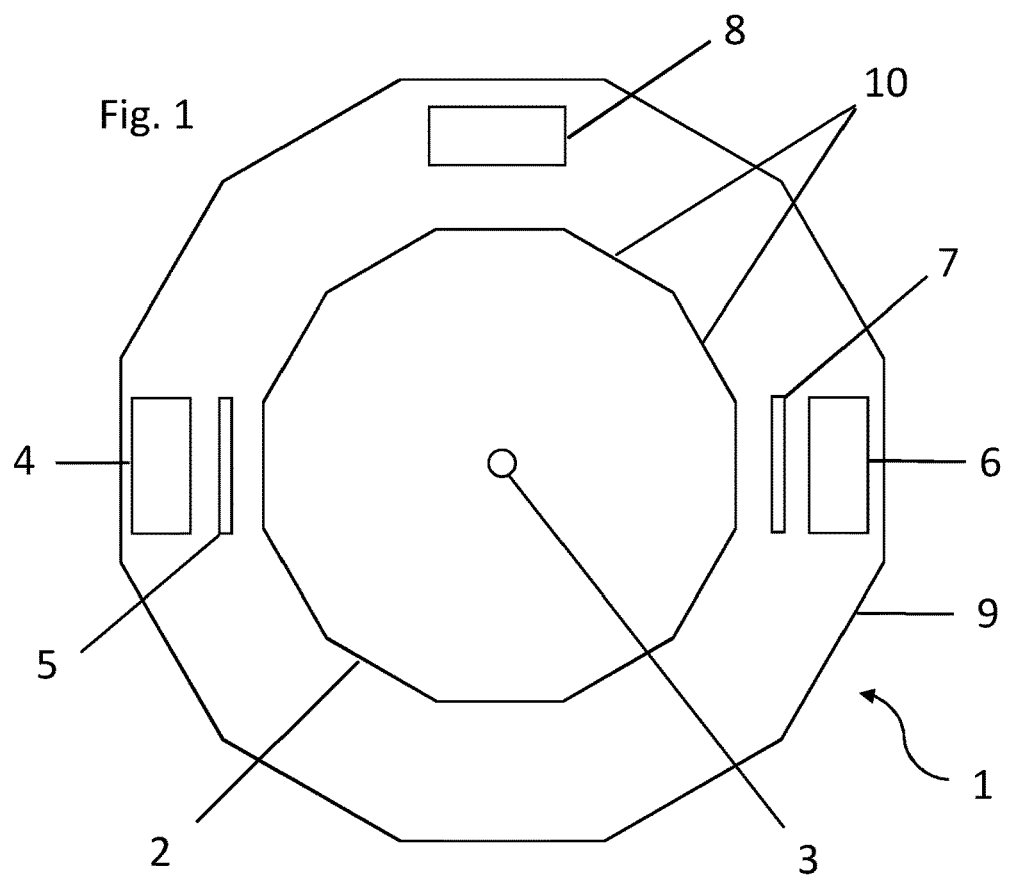
FIG. 1 shows a schematic cross section through apparatus for depositing germanium and carbon.

FIG. 1 shows schematically deposition apparatus 1 for depositing a thin film comprising germanium and carbon. The apparatus 1 includes a rotatable drum mount 2 mounted on a substantially horizontal axle 3, first and second pulsed DC magnetron sputtering sources 4 and 6, each provided with respective sputtering masks 5 and 7, and a microwave plasma source 8, all provided within a vacuum chamber 9. The drum mount 2 has the shape of a dodecagonal prism, the axle 3 extending along the longitudinal axis of the prism and each external prism face 10 comprising a bracket for receiving a deposition substrate.

The first pulsed DC magnetron sputtering source 4 is set up such that, when turned on, it generates and confines a substantially rectangular, planar plasma adjacent to a germanium target, to thereby sputter germanium atoms towards the drum. The second pulsed DC magnetron sputtering source 6 is also set up such that, when turned on, it generates and confines a substantially rectangular, planar plasma adjacent to a carbon target, to thereby sputter carbon atoms towards the drum. The microwave plasma source 8 is supplied with a flow of hydrogen gas to generate a flow of hydrogen ions towards the drum.

Figure 2:
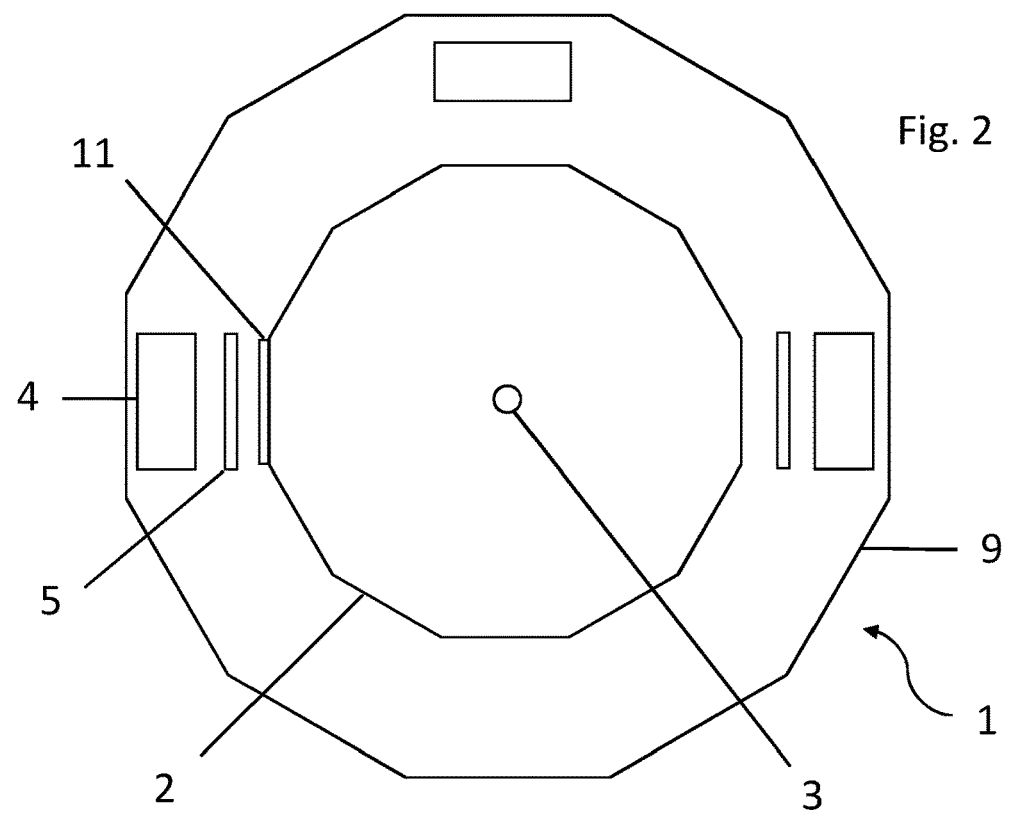
FIG. 2 shows the deposition apparatus of FIG. 1 with a substrate positioned in front of a first pulsed DC magnetron sputtering source provided with a germanium target.

In use, a substrate 11 (such as a chalcogenide glass substrate) is mounted on one of the flat external surfaces of the drum and the drum is rotated continuously about the axle 3 at a speed of 60 rpm. The vacuum chamber is evacuated and backfilled with argon or another inert gas. The first pulsed DC magnetron sputtering source 4 is switched on, as is the microwave plasma source 8. As shown in FIG. 2, the substrate 11 is first rotated past the first sputtering source 4, which sputters germanium atoms towards the drum. A portion of the sputtered material is blocked by the sputtering mask 5 but the remainder of the sputtered material is able to pass through the sputtering mask 5 to deposit one or two monolayers of germanium onto the substrate.

As shown in FIG. 3, the substrate is subsequently rotated past the microwave plasma source 8. As the substrate passes the microwave plasma source, high-energy hydrogen ions are directed onto the substrate. Exposure to hydrogen plasma enhances the durability of the deposited germanium layer through densification. Exposure to hydrogen plasma also passivates and reduces the number of dangling bonds on the exposed surface of the deposited germanium.

Each time the substrate passes the first sputtering source 4, a few more monolayers of germanium are deposited onto the existing layers of germanium. Each time the substrate passes the plasma source 8, these monolayers of germanium are exposed to the hydrogen plasma. Over repeated passes of the substrate past the first sputtering source and the plasma source, the thickness of a layer of germanium is built up a few monolayers at a time until a desired thickness is achieved.

At this point the first sputtering source 4 is switched off and the second sputtering source 6 is switched on. As the substrate is rotated past the second sputtering source, a portion of the sputtered material is blocked by the sputtering mask 7 but the remainder of the sputtered material is able to pass through the sputtering mask 7 to deposit one or two monolayers of carbon on top of the layer of germanium. The substrate is subsequently rotated past the plasma source which exposes the carbon layer to hydrogen plasma. Exposure to hydrogen plasma enhances the durability of the deposited carbon layer through densification. Exposure to hydrogen plasma also passivates and reduces the number of dangling bonds on the exposed surface of the deposited carbon. Over repeated passes of the substrate past the second sputtering source and the plasma source, the thickness of a layer of carbon is built up a few monolayers at a time until a desired thickness is achieved.

As rotation of the drum continues, the first and second sputtering sources are repeatedly switched on and off to deposit alternating layers of germanium and carbon onto the substrate.

The rotational speed of the drum is such that only one or two monolayers of material are deposited during each pass through each of the germanium and carbon sputtering zones, which provides precise control over the layer thicknesses and the composition of the resultant thin film.

Even more precise control over the thin film stoichiometry and structure can be achieved through use of first and second quartz crystal microbalances 12A and 12B. As shown in FIG. 5, the quartz crystal microbalances 12A and 12B are mounted onto a rear wall of the vacuum chamber within the drum 2. The microbalances are fixed in position and do not rotate with the drum. An aperture is provided in the drum and is positioned adjacent to the substrate such that, when the substrate moves in front of the first sputtering source 4, sputtered germanium is able to pass through the aperture in the drum and reach the first quartz crystal microbalance 12A, and when the substrate moves in front of the second sputtering source 6, sputtered carbon is able to pass through the aperture in the drum and reach the second quartz crystal microbalance 12B. The first and second quartz crystal microbalances each have a sensing surface and are configured to measure the amount of material deposited onto the said sensing surface. The first and second quartz crystal microbalances output signals dependent on the measured amounts of deposited material, which are received by a controller (not shown). The controller is connected to both the first and second sputtering devices and to an actuator which drives rotation of the drum 2. The controller is programmed to adjust the power supply to each of the first and second sputtering devices (including, for example, switching each of the first and second sputtering devices on or off) and/or to adjust the speed of rotation of the drum responsive to the measured amounts of deposited material. By controlling the power supplied to each sputtering device and the speed of rotation of the drum, the amount of material deposited onto the substrate as it passes through each sputtering zone can be controlled with monolayer precision. This permits the stoichiometry of the deposited thin film to be controlled very accurately.

The apparatus may be used to deposit layered structures comprising germanium and carbon, for example where each individual layer comprises a few monolayers of germanium or carbon respectively. The power supplied to each of the sputtering devices and the speed of rotation of the drum may be selected such that the thickness of each layer of germanium and carbon are similar. Alternatively, the power supplied to each of the sputtering devices and the speed of rotation of the drum can be controlled so as to deposit a thin film in which the composition (e.g. the concentration of germanium and/or carbon) varies continuously along a direction normal to the substrate surface, such as a rugate structure where the resultant refractive index of thin film also varies continuously along the normal direction.

In practice, one or more substrates may be mounted to each external, planar face of the drum, permitting a plurality of layered structures to be deposited at the same time. This significantly increases throughput compared to existing deposition technologies. The polygonal drum permits a high surface area of substrate to be coated for a given vacuum chamber volume.

An aperture may be provided in the drum adjacent to each substrate such that the deposition rates of germanium and carbon may be measured by the first and second quartz microbalances located within the drum. Alternatively, a single circumferential aperture may extend around the drum adjacent to each substrate.

The sputtering masks 5 and 7 are typically selected dependent on the desired spatial variation in thickness of the deposited layers. For example, sputtering masks can be designed to ensure a uniform thickness of deposited material. Alternatively, sputtering masks can be designed to ensure a non-uniform thickness of deposited material (such as a thickness which is uniform along a first direction in the plane of the substrate but non-uniform in a second direction in said plane of the substrate).

FIG. 6 shows the results of testing the properties of a 1 μm thick film of stoichiometric germanium carbide deposited on germanium, zinc selenide and chalcogenide substrates using the apparatus described hereinabove. In each case the film was tested for adhesion, humidity and severe abrasion properties using the US Military Test Standard Mil_C_48497A, for salt spray resistance using the US Military Test Standard Mil_C_675C para 4.5.9, and for the sand wiper test according to the UK Military Test Standard TS1888 para 5.4.3. These tests are designed to simulate the typical environments to which optical coatings may be subjected in military applications. The germanium carbide film passed each standardised test.

Figure 7:
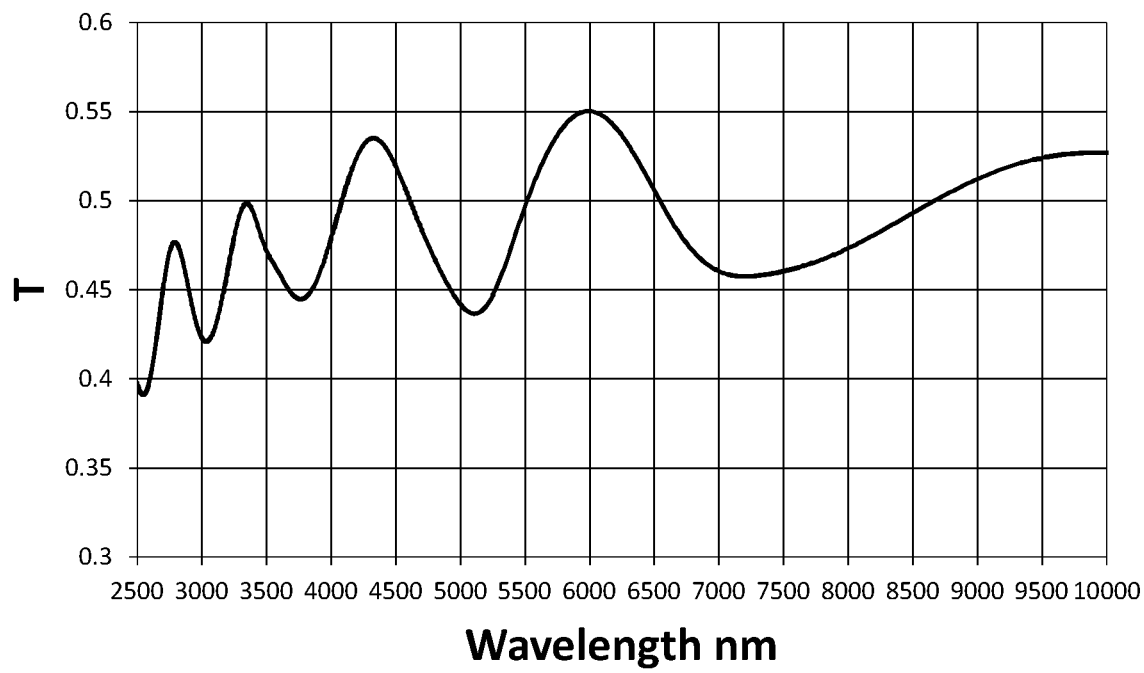
FIG. 7 shows the optical transmission as a function of wavelength of incident light for a 2.46 µm thick layer of germanium carbide having a germanium volume fraction of 0.567 deposited on a germanium substrate.

FIG. 7 shows the results of testing the optical transmission of a single layer of germanium carbide, having a germanium volume fraction of 0.567 and a thickness of 2.46 μm, deposited on a germanium substrate using the apparatus described hereinabove. The transmission is seen to oscillate as a function of wavelength of incident light. The refractive index of this film was found to be 3.058 at a wavelength of 5000 nm.

Figure 8:
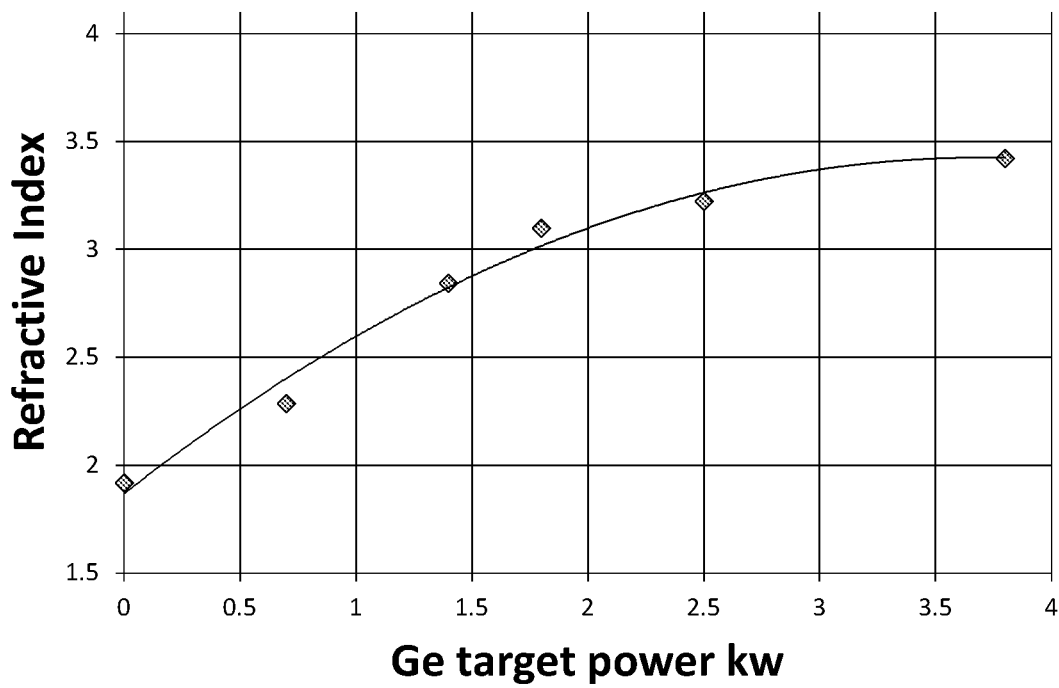
FIG. 8 shows the refractive index measured using infra-red light at 3 µm for six different germanium carbide films deposited using different germanium target powers.
Figure 9:
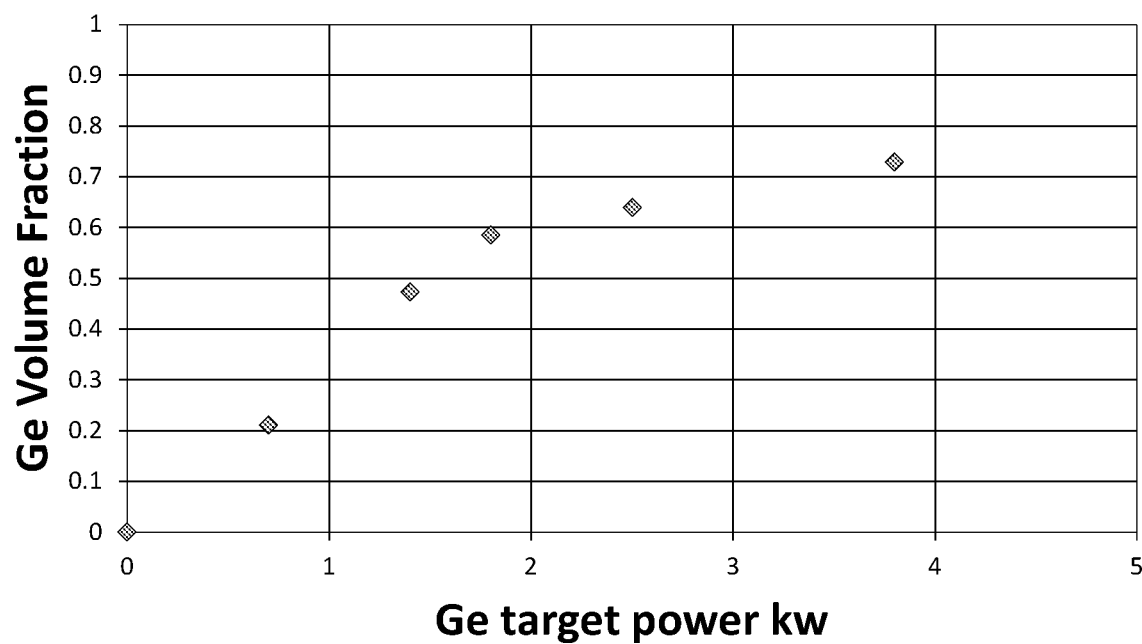
FIG. 9 shows the volume fraction of germanium in each deposited film shown in FIG. 8.
Figure 10:
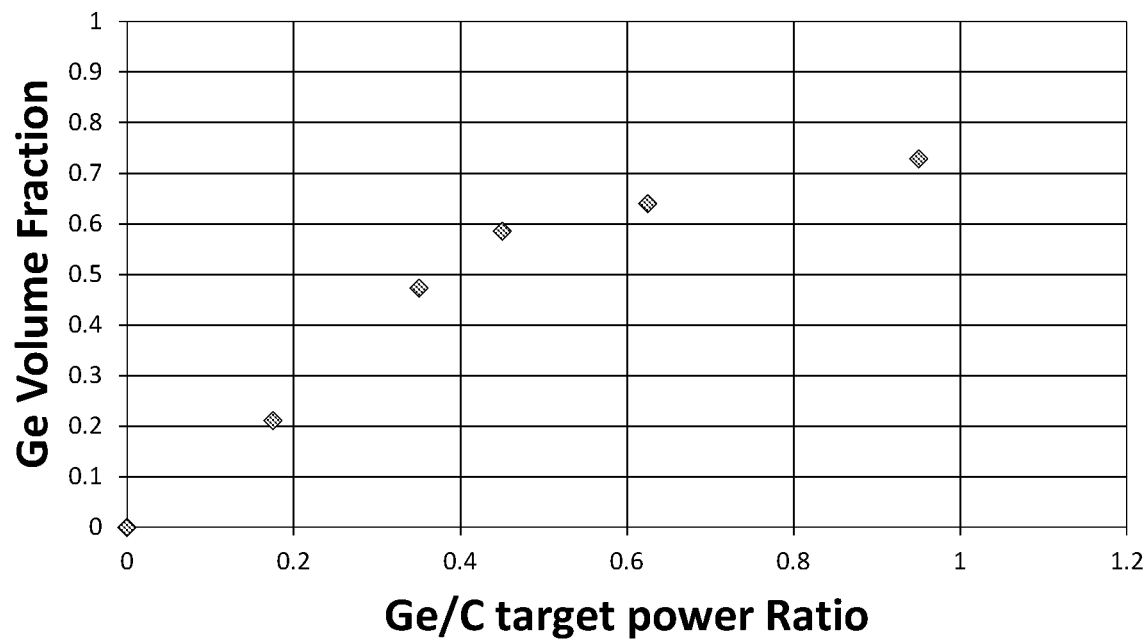
FIG. 10 shows the same data as FIG. 9 plotted as a function of the ratio of the germanium target power to the carbon target power.

FIG. 8 shows the refractive index measured using infrared light at 3 μm for six different germanium carbide films deposited using different germanium target powers. As the power supplied to the germanium target increases, the volume fraction of germanium in the deposited film increases and therefore so does the refractive index. The variation in germanium volume fraction as calculated using a Bruggeman model with the refractive index data of FIG. 8 as the input is shown in FIG. 9. FIG. 10 shows the same data plotted as a function of the ratio of the germanium target power to the carbon target power.

Figure 11:
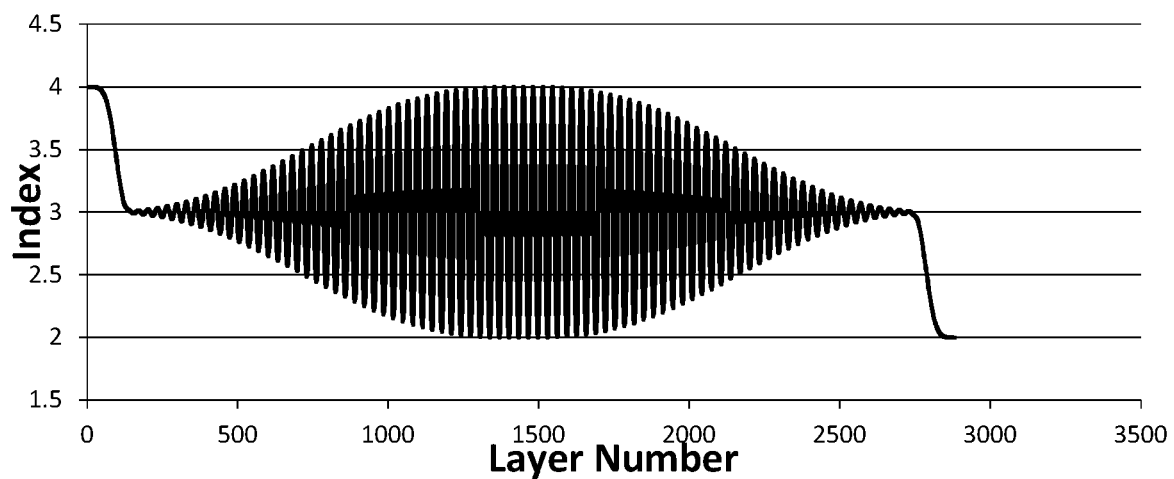
FIG. 11 shows the variation in refractive index as a function of layer number in a germanium carbide rugate structure rugate filter.

Because the refractive index of the deposited film depends sensitively on the volume fractions of germanium and carbon, rugate structures having alternating refractive indices can be deposited by continuously varying the power supplied to the germanium and carbon targets (and thus continuously varying the germanium and carbon volume fractions in the deposited films) during deposition. For example, FIG. 11 shows the variation in refractive index which was achieved in a germanium carbide rugate structure in which the volume fraction of germanium was varied from 0 to 1 and back again 90 times during deposition. The variation in the deposited volume fraction was given by the following quintic function:

$$f(x) = 10x^3 - 15x^4 + 6x^5,$$

apodised using an exponential function.

Figure 12:
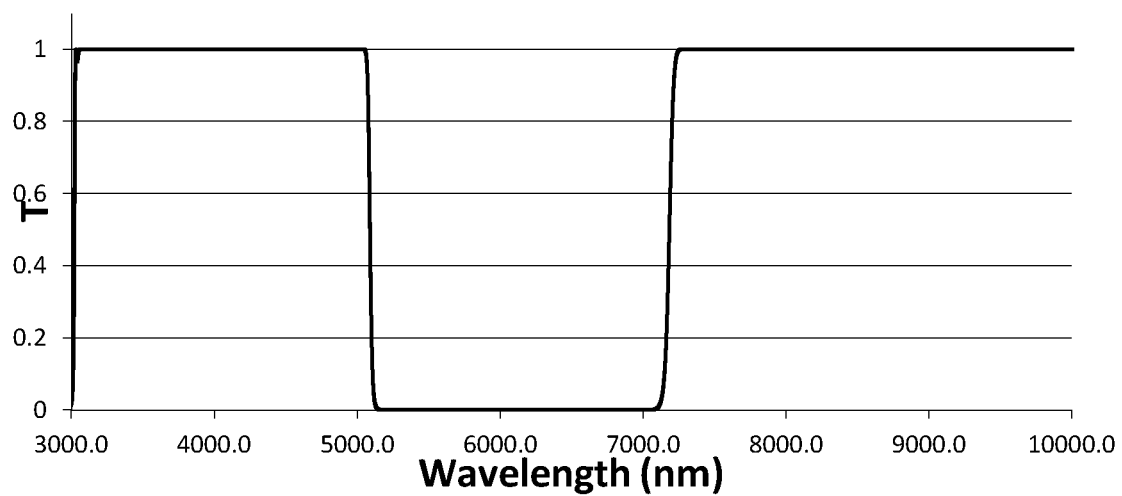
FIG. 12 shows the transmission of the rugate structure of FIG. 11 as a function of wavelength of incident light.

Each volume fraction cycle involved the deposition of 32 layers of material, each layer having a different composition. The physical thickness of each layer was different and was chosen such that the optical thickness of each layer was the same. The refractive index observed oscillates 90 times from 2 (equivalent to the refractive index of pure carbon) to 4 (equivalent to the refractive index of pure germanium). The average refractive index of the rugate structure is 3. This finely-structure rugate film can be used as a rugate filter; FIG. 12 shows the transmission of the rugate structure as a function of wavelength of incident light. The structure blocks light having wavelengths between approximately 5000 nm and 7200 nm. This rejection bandwidth can be turned by varying the refractive index range of the rugate structure. A narrower index range results in a narrower rejection bandwidth.

Further variations and modifications may be made within the scope of the invention herein disclosed.

The invention claimed is:

1. Apparatus for depositing an infra-red transmissive, anti-reflection coating, formed from a multi-layered structure comprising at least four alternating layers of germanium and carbon, onto one or more substrates, the apparatus comprising a vacuum chamber, at least first and second magnetron sputtering devices and at least one movable mount for supporting the one or more substrates within the vacuum chamber, the first magnetron sputtering device being configured to sputter germanium towards the at least one mount from a first sputtering target comprising germanium, thereby defining a germanium sputtering zone within the vacuum chamber, the second magnetron sputtering device being configured to sputter carbon towards the at least one mount from a second sputtering target comprising carbon, thereby defining a carbon sputtering zone within the vacuum chamber, and the at least one mount and the at least first and second magnetron sputtering devices being arranged such that, when each substrate is moved through the germanium sputtering zone on the at least one movable mount, germanium is deposited on the said substrate, and when each substrate is moved through the carbon sputtering zone on the at least one movable mount, carbon is deposited on the said substrate, wherein the first and second magnetron sputtering devices and the at least one movable mount are configured to repeat the deposition of germanium and carbon such that the at least four alternating layers of germanium and carbon are formed, wherein the apparatus further comprises at least one plasma processing device configured to direct hydrogen ions towards the mount, thereby defining a plasma hydrogenation zone within the vacuum chamber and resulting in hydrogenation of at least one germanium layer deposited on the said substrate, wherein both the first magnetron sputtering device and the second magnetron sputtering device are pulsed DC magnetron sputtering devices, each configured to pulse the DC electric field, or vary the magnitude and polarity of the DC electric field at a frequency of between 10 kHz to 350 kHz.

2. The apparatus according to claim 1 comprising at least one deposition sensor configured to measure a parameter indicative of the amount of germanium and/or carbon which is deposited onto a sensing surface of the said deposition sensor.

3. The apparatus according to claim 2 comprising a controller configured to receive measurements of the said parameter from the at least one deposition sensor and to cause a change in the movement of the at least one movable mount and/or a change in the intensity of sputtering at the first magnetron sputtering device and/or the second magnetron sputtering device responsive to the received measurements.

4. The apparatus according to claim 2, comprising a first deposition sensor and a second deposition sensor, the first deposition sensor being configured to measure a first parameter indicative of the amount of germanium which is deposited onto a sensing surface of the said first deposition sensor from the first magnetron sputtering device, the second deposition sensor being configured to measure a second parameter indicative of the amount of carbon which is deposited onto a sensing surface of the said second deposition sensor from the second magnetron sputtering device.

5. The apparatus according to claim 2, wherein one or more of the at least one deposition sensor comprises a quartz crystal microbalance.

6. The apparatus according to claim 1, wherein the at least one mount is rotatable.

7. The apparatus according to claim 6, wherein the at least one mount is a drum rotatable about a longitudinal axis thereof.

8. The apparatus according to claim 6, wherein the apparatus comprises means for rotating the at least one mount such that the one or more substrates supported by the at least one mount are moved through the germanium and carbon sputtering zones.

9. An apparatus according to claim 1, wherein the apparatus comprises a baffle configured to confine sputtered germanium and/or carbon within their respective sputtering zones.

10. The apparatus according to claim 2, wherein the at least one mount is a drum rotatable about a longitudinal axis thereof and wherein one or more of the at least one deposition sensor is mounted within the drum.

11. An apparatus according to claim 10, wherein the apparatus comprises one or more apertures in the drum, located between the at least one deposition sensor and the first and/or second magnetron sputtering devices.

12. An apparatus according to claim 11, wherein the one or more apertures are distributed around a circumference of the drum.

13. A method for depositing an infra-red transmissive, anti-reflection coating, formed from a multi-layered structure comprising at least four alternating layers of germanium and carbon onto one or more substrates, the method comprising: at least one first magnetron sputtering device sputtering germanium from a first sputtering target comprising germanium to thereby define a germanium sputtering zone within a vacuum chamber; at least one mount moving the one or more substrates through the germanium sputtering zone so that germanium is deposited on each said substrate; at least one second magnetron sputtering device sputtering carbon from a second sputtering target comprising carbon to thereby define a carbon sputtering zone within the vacuum chamber; at least one mount moving the one or more substrates through the carbon sputtering zone so that carbon is deposited on each said substrate, wherein the deposition of germanium and carbon is repeated to build up the at least four alternating layers of germanium and carbon, wherein the method further comprises at least one plasma processing device directing hydrogen ions towards the mount, thereby defining a plasma hydrogenation zone within the vacuum chamber and resulting in hydrogenation of at least one germanium layer deposited on each said substrate, and wherein both the first magnetron sputtering device and the second magnetron sputtering device are pulsed DC magnetron sputtering devices, and wherein the method further comprises either pulsing the DC electric field, or varying the magnitude and polarity of the DC electric field, at a frequency of between 10 kHz to 350 kHz.

14. The method according to claim 13 comprising a deposition sensor measuring a parameter indicative of the amount of germanium and/or carbon which is deposited onto a sensing surface of the said deposition sensor.

15. The method according to claim 14 comprising a controller receiving measurements of the said parameter from the deposition sensor and causing a change in the movement of the at least one movable mount and/or a change in the intensity of sputtering at the first magnetron sputtering device and/or the second magnetron sputtering device responsive to the received measurements.

16. The method according to claim 13, wherein the at least one mount is rotatable and the method comprises rotating the at least one mount such that the one or more substrates supported by the said at least one mount are moved through the germanium and carbon sputtering zones.

17. The method according to claim 13, wherein the germanium sputtering zone and the carbon sputtering zone do not overlap.

18. The method according to claim 13, wherein the one or more substrates are one or more substrates formed from chalcogenide glass.

19. An optical device comprising a substrate and an infra-red transmissive, anti-reflection thin film, the thin film comprising a multi-layered structure comprising at least four alternating layers of germanium and carbon, deposited thereon by the method according to claim 13.

20. The optical device according to claim 19, wherein the substrate comprises an infra-red transmissive optical region.

\* \* \* \* \*